(12) United States Patent
Joshi et al.

(10) Patent No.: US 11,220,426 B2
(45) Date of Patent: Jan. 11, 2022

(54) METHODS FOR FORMING FLOW CHANNELS IN METAL INVERSE OPAL STRUCTURES

(71) Applicants: Toyota Motor Engineering & Manufacturing North America, Inc., Plano, TX (US); The Board of Trustees of the University of Illinois, Champaign, IL (US)

(72) Inventors: Shailesh N. Joshi, Ann Arbor, MI (US); Paul Braun, Champaign, IL (US); Julia Kohanek, Champaign, IL (US); Gaurav Singhal, Maharashtra (IN)

(73) Assignees: TOYOTA MOTOR ENGINEERING & MANUFACTURING NORTH AMERICA, INC., Plano, TX (US); THE BOARD OF TRUSTEES OF THE UNIVERSITY OF ILLINOIS, Champaign, IL (US)

( * ) Notice: Subject to any disclaimer, the term of this patent is extended or adjusted under 35 U.S.C. 154(b) by 0 days.

(21) Appl. No.: 16/776,813

(22) Filed: Jan. 30, 2020

(65) Prior Publication Data
US 2021/0238033 A1 Aug. 5, 2021

(51) Int. Cl.
| | |
|---|---|
| *B82B 3/00* | (2006.01) |
| *C04B 38/04* | (2006.01) |
| *B82Y 40/00* | (2011.01) |
| *B82Y 30/00* | (2011.01) |
| *B81C 1/00* | (2006.01) |
| *C04B 111/40* | (2006.01) |
| *C04B 111/00* | (2006.01) |

(52) U.S. Cl.
CPC ........ *B82B 3/0066* (2013.01); *B81C 1/00031* (2013.01); *B81C 1/00055* (2013.01); *B81C 1/00071* (2013.01); *B82Y 30/00* (2013.01); *B82Y 40/00* (2013.01); *C04B 38/045* (2013.01); *C04B 2111/00008* (2013.01); *C04B 2111/40* (2013.01)

(58) Field of Classification Search
None
See application file for complete search history.

(56) References Cited

U.S. PATENT DOCUMENTS

| 8,237,538 B2 | 8/2012 | Braun et al. |
| 9,559,349 B2 * | 1/2017 | Braun ................. H01M 4/0404 |

(Continued)

FOREIGN PATENT DOCUMENTS

| CN | 107478638 A | 12/2017 |
| EP | 1743209 B1 | 11/2016 |
| WO | 2004099470 A1 | 11/2004 |

*Primary Examiner* — Stephanie P Duclair
(74) *Attorney, Agent, or Firm* — Dinsmore & Shohl LLP

(57) ABSTRACT

A method for forming a flow channel in a MIO structure includes positioning a plurality of sacrificial spheres along a base substrate, heating a region of the plurality of sacrificial spheres above a melting point of the plurality of sacrificial spheres, thereby fusing the plurality of sacrificial spheres together and forming a solid channel, electrodepositing material between the plurality of sacrificial spheres and around the solid channel, removing the plurality of sacrificial spheres to form the MIO structure, and removing the solid channel to form the flow channel extending through the MIO structure.

19 Claims, 7 Drawing Sheets

(56) References Cited

U.S. PATENT DOCUMENTS

2008/0253411 A1 10/2008 Mcphail et al.
2009/0174117 A1* 7/2009 Winkler ................ C04B 38/045
                                                                                         264/319

* cited by examiner

METHODS FOR FORMING FLOW CHANNELS IN METAL INVERSE OPAL STRUCTURES

BACKGROUND

Field

The present specification generally relates to methods for forming assemblies that cool heat-generating devices, and more particularly to methods for forming flow channels in metal inverse opal structures of assemblies for cooling a heat-generating devices.

Technical Background

As electronics assemblies are designed to operate at increased power levels to meet the increased demands of electrical systems, the electronics assemblies generate increased heat, and conventional heat sinks are increasingly insufficient to effectively lower the operating temperature of the electronics assemblies to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics assembly more challenging.

Metal inverse opal (MIO) structures can assist in dissipating heat from heat-generating devices, such as power electronics assemblies. For example, MIO structures are porous, providing increased surface are to engage with a cooling fluid to facilitate heat transfer from the power electronics assembly to the cooling fluid. However, the small size of pores of conventional MIO structures may significantly restrict the flow of cooling fluid through the MIO structure, and the restricted flow of cooling fluid may prevent sufficient volume of cooling fluid from reaching desired areas of the assembly.

SUMMARY

The inventors of the present disclosure have identified a need to improve the flow of cooling fluid through MIO structures to improve cooling of heat-generating devices. In particular, embodiments according to the present disclosure are generally directed to methods for forming flow channels in MIO structures.

In one embodiment, a method for forming a flow channel in a MIO structure includes positioning a plurality of sacrificial spheres along a base substrate, heating a region of the plurality of sacrificial spheres above a melting point of the plurality of sacrificial spheres, thereby fusing the plurality of sacrificial spheres together and forming a solid channel, electrodepositing material between the plurality of sacrificial spheres and around the solid channel, removing the plurality of sacrificial spheres to form the MIO structure, and removing the solid channel to form the flow channel extending through the MIO structure.

In another embodiment, a method for forming a flow channel in a MIO structure includes positioning a plurality of sacrificial spheres along a base substrate, positioning a solid channel between spheres of the plurality of sacrificial spheres, electrodepositing material between the plurality of sacrificial spheres and around the solid channel, removing the plurality of sacrificial spheres to form the MIO structure, and removing the solid channel to form the flow channel extending through the MIO structure.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

Embodiments described herein are directed to methods for forming assemblies for cooling heat-generating devices. The heat-generating devices may include, as one example, electronics modules including a power electronics device. Power electronics devices generally generate heat during operation that should be dissipated, and cooling fluid may be utilized to dissipate the heat.

Embodiments described herein are directed to cooling assemblies including a MIO structure. One or more flow channels are formed within the MIO structure, and cooling fluid may be passed through the one or more flow channels. The one or more flow channels can increase the amount of cooling fluid that may be passed through the MIO structure, thereby increasing the amount of heat that can be dissipated from the heat-generating device. Further, in some applications, the one or more flow channels may be utilized to direct the cooling fluid through the MIO structure, for example to impinge the cooling fluid on a target surface to cool the heat-generating device. Various embodiments of assemblies and methods for forming the assemblies will be described herein with specific reference to the appended drawings.

Figure 1A:
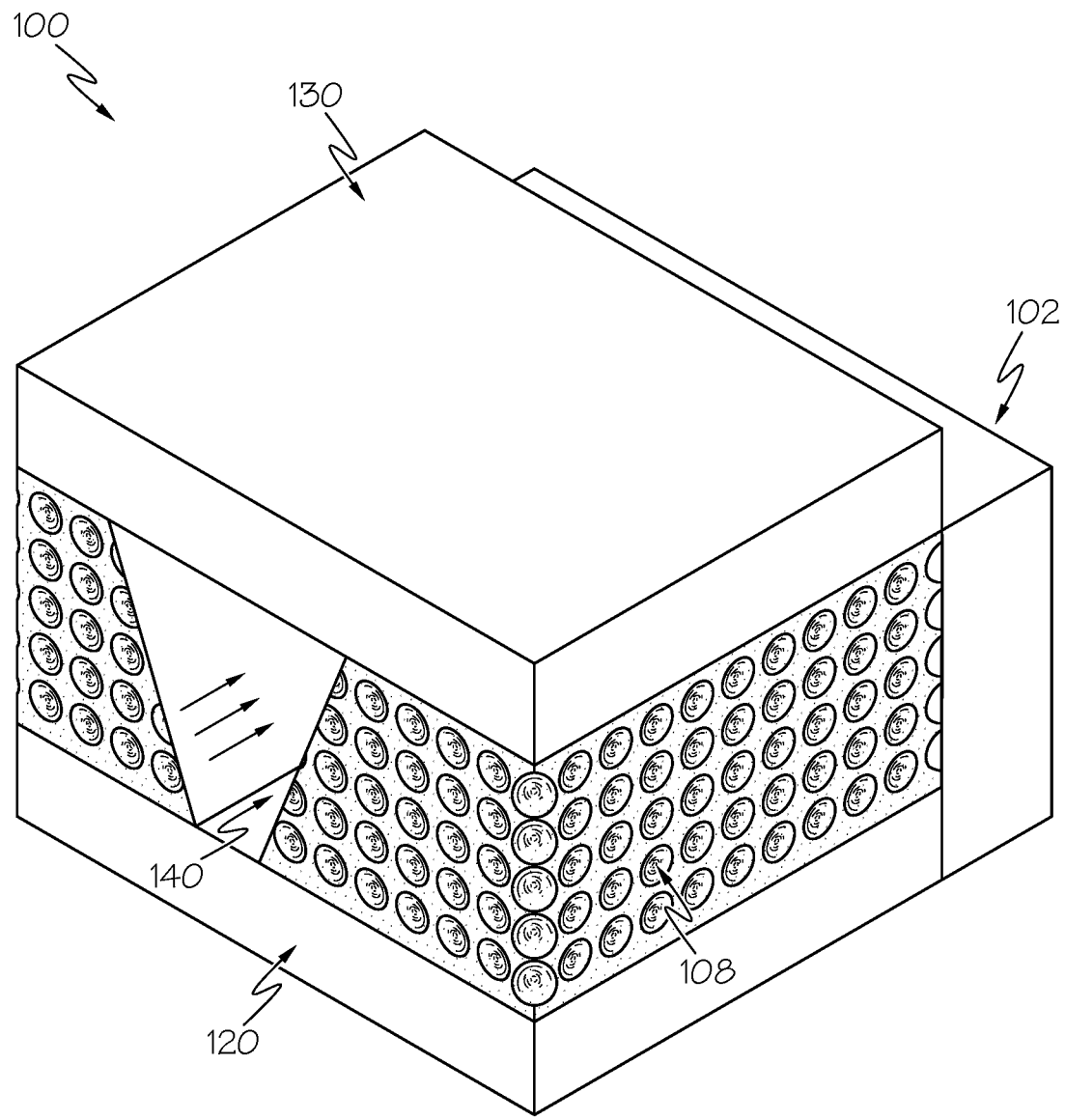
FIG. 1A schematically depicts a perspective view of an assembly including a heat-generating device, according to one or more embodiments shown and described herein.
Figure 1B:
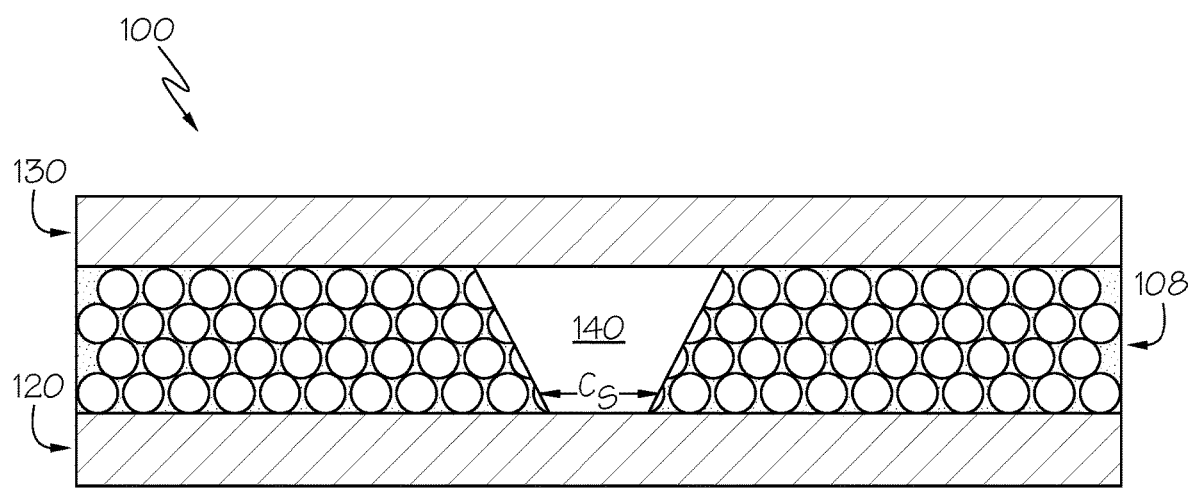
FIG. 1B schematically depicts a front view of the assembly of FIG. 1A, according to one or more embodiments shown and described herein.

Referring initially to FIGS. 1A and 1B, a perspective view and a front view of an assembly 100 are depicted, respectively. The example assembly 100 generally includes a heat-generating device 102, a MIO structure 108, and a base substrate 120. The heat-generating device 102 can include a power electronics device, such as a semiconductor device or other electronic device that generates heat. In some embodiments, the heat-generating device 102 may be formed from wide band gap semiconductor materials suitable for the manufacture or production of power semiconductor devices, such as, for example, a power insulated-gate bi-polar transistor (IGBT), a power metal-oxide field-effect transistor (MOSFET), a power transistor, and the like. Non-limiting examples of such wide band gap semiconductor materials include silicon carbide (SiC), aluminum nitride (AlN), gallium nitride (GaN), gallium oxide ($Ga_2O_3$), boron nitride (BN), diamond, and/or the like.

In the embodiment depicted in FIG. 1A, the assembly 100 includes a capping layer 130 positioned over the MIO structure 108. In some embodiments, the capping layer 130 may be formed of a metal, such as nickel, copper, or the like, and may be formed from the same material as the MIO structure 108. In some embodiments, for example, in embodiments in which the heat-generating device 102 includes an electronic device, the capping layer 130 may be electrically coupled to the heat-generating device 102. Further, while in the embodiment depicted in FIG. 1A the capping layer 130 is positioned adjacent to the heat-generating device 102, it should be understood that in some embodiments, the heat-generating device 102 and/or other electronic devices may be positioned on the capping layer 130.

In some embodiments, the capping layer 130 is a dielectric layer, and may be formed of an electrically-insulating material, such as aluminum oxide or the like. While the embodiment depicted in FIG. 1 includes the capping layer 130, it should be understood that this is merely an example, and in some embodiments, the capping layer 130 may be omitted. Further, while the capping layer is depicted as including a generally planar shape, it should be understood that the capping layer 130 may include any suitable shape and may include curvature. Further, while the capping layer 130 is depicted as including a solid structure, it should be understood that in some embodiments, the capping layer 130 may include one or more pores.

In embodiments, the MIO structure 108 and the base substrate 120 are thermally coupled to the heat-generating device 102, such that thermal energy is transferred from the heat generating device to the MIO structure 108 and the base substrate 120. In embodiments that include the capping layer 130, the capping layer 130 may also be thermally coupled to the heat-generating device 102. As thermal energy is transmitted from the heat-generating device 102 to the MIO structure 108 and the base substrate 120, heat generated by the heat-generating device 102 may be dissipated, which can assist in maintaining the heat-generating device 102 within a range of acceptable operating temperatures. In some embodiments, a heat sink or the like may also be thermally coupled to the heat-generating device 102, for example through the base substrate 120 to further dissipate thermal energy produced by the heat-generating device 102.

Figure 2:
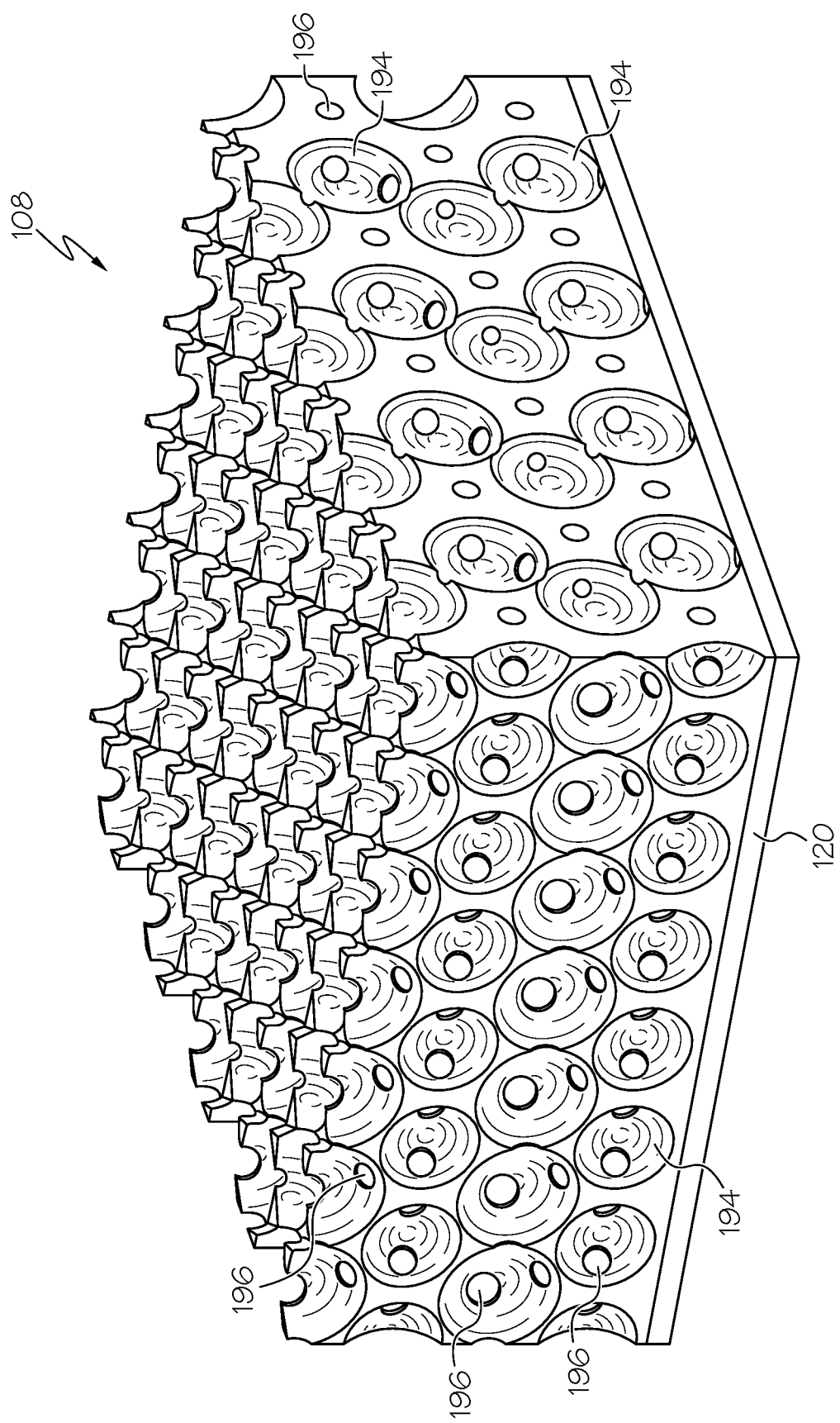
FIG. 2 schematically depicts an enlarged perspective section view of a MIO structure of the assembly of FIG. 1A, according to one or more embodiments shown and described herein.

Referring collectively to FIGS. 1A, 1B, and 2, an enlarged perspective section view of the MIO structure 108 is schematically depicted. In embodiments, the MIO structure 108 includes a plurality of cavities 194 and a plurality of networked pores 196 that connect cavities of the plurality of cavities 194. In embodiments, the networked pores 196 extend throughout the MIO structure 108 such that cooling fluid can flow through each of the plurality of cavities 194. In the embodiment depicted in FIG. 2, each of the plurality of cavities 194 define a generally spherical shape, and the plurality of cavities 194 generally act to increase the surface area of the MIO structure 108 that can be exposed to cooling fluid, thereby increasing the amount of thermal energy that can be transferred to the cooling fluid from the MIO structure 108. Further, geometry of the plurality of cavities 194 and/or the plurality of networked pores 196 may assist in nucleation of the cooling fluid, further assisting in transferring thermal energy from the MIO structure 108. For example and without being bound by theory, thermal energy is required for the cooling fluid to change phase (e.g., from a liquid phase to a solid phase, or from a liquid phase or solid phase to a supercritical phase), and accordingly, the cooling fluid may absorb significant amounts of thermal energy when changing phase. As such, by encouraging nucleation of the cooling fluid, the geometry of the plurality of cavities 194 and/or the plurality of networked pores 196 may assist in transferring thermal energy from the MIO structure 108 to cooling fluid being passed through the MIO structure 108. As the MIO structure 108 is thermally coupled to the heat-generating device 102, by transferring thermal energy from the MIO structure 108 to the cooling fluid, thermal energy from the heat-generating device 102 may be dissipated by way of the MIO structure 108.

While in the embodiment depicted in FIGS. 1A, 1B, and 2, the MIO structure 108 defines cavities 194 that are regularly spaced from one another it should be understood that this is merely an example and the cavities 194 may be positioned at irregular intervals from one another. The MIO structure 108 may be formed of any suitable metal or metal alloy, polymer, semiconductor, and may be for example, a copper inverse opal (CIO) structure, a nickel inverse opal (NIO) structure, and/or the like.

Referring particularly to FIGS. 1A and 1B, in embodiments, the MIO structure 108 comprises one or more flow channels 140 extending through the MIO structure 108. While the embodiment depicted in FIGS. 1A and 1B shows a single flow channel 140, it should be understood that assemblies 100 according to the present disclosure may include multiple flow channels 140, and one or more of the flow channels 140 may be interconnected with one another. In operation, cooling fluid may be passed through the flow channel 140. The flow channel 140 may be arranged to direct cooling fluid to desired regions of the assembly 100 acting as a conduit for the cooling fluid. Further, in some embodiments and as shown in FIG. 1A, the flow channel 140 may direct cooling fluid to impinge on a target surface to cool the heat-generating device 102, facilitating jet impingement cooling of the heat-generating device 102. Once the cooling fluid passing through the flow channel 140 has impinged on the target surface, the cooling fluid may generally flow outward from the flow channel 140, either through the plurality of networked pores 196 (FIG. 2) of the MIO structure 108, or through other flow channels (not depicted) defined in the MIO structure 108.

In embodiments, the flow channel 140 defines a channel span Cs evaluated between opposing sides of the flow channel 140. In contrast to the comparatively small size of the plurality of networked pores 196 (FIG. 2), the channel span Cs is comparatively large, allowing cooling fluid to easily flow through the MIO structure 108 through the flow channel 140. In embodiments, the channel span Cs is between about 1 micrometer and 100 micrometers, inclusive of the endpoints.

In some embodiments, the channel span Cs may vary moving along the thickness of the MIO structure 108. For example, in the embodiment depicted in FIGS. 1A and 1B, the flow channel 140 defines a trapezoidal cross-section, with the channel span Cs increasing moving upward along the thickness of the MIO structure 108. While in the embodiment depicted in FIG. 1, the flow channel 140 includes a generally trapezoidal cross-section, it should be understood that this is merely an example. For example, in some embodiments, the flow channel 140 may have a circular cross-section, a rectangular cross-section, or the like, as described in greater detail herein. Furthermore, while in the embodiment depicted in FIGS. 1A and 1B, the flow channel 140 extends through a thickness of the MIO structure 108 (i.e., between the base substrate 120 and the capping layer 130 and/or the heat-generating device 102), it should be understood that the flow channel 140 may extend only partially through the thickness of the MIO structure 108. For example, in some embodiments, the flow channel 140 may be bounded by the base substrate 120 at a lower portion of the flow channel 140 and may be bounded by the MIO structure 108 at an upper portion of the flow channel 140. By contrast, in some embodiments, the flow channel 140 may be bounded by the MIO structure 108 at the lower portion of the flow channel 140, and may be bounded by the capping layer 130 and/or the heat-generating device 102 at the upper portion of the flow channel 140. In some embodiments, the flow channel 140 may be bounded entirely by the MIO structure 108.

The base substrate 120 is engaged with the MIO structure 108. In some embodiments, the base substrate 120 may be formed of a metal, such as copper, nickel, an alloy, or the like. In some embodiments, the base substrate 120 is electrically coupled to the heat-generating device 102.

Methods for producing the assembly 100 and methods for forming the flow channel 140 within the MIO structure 108 will now be described.

Figure 3A:
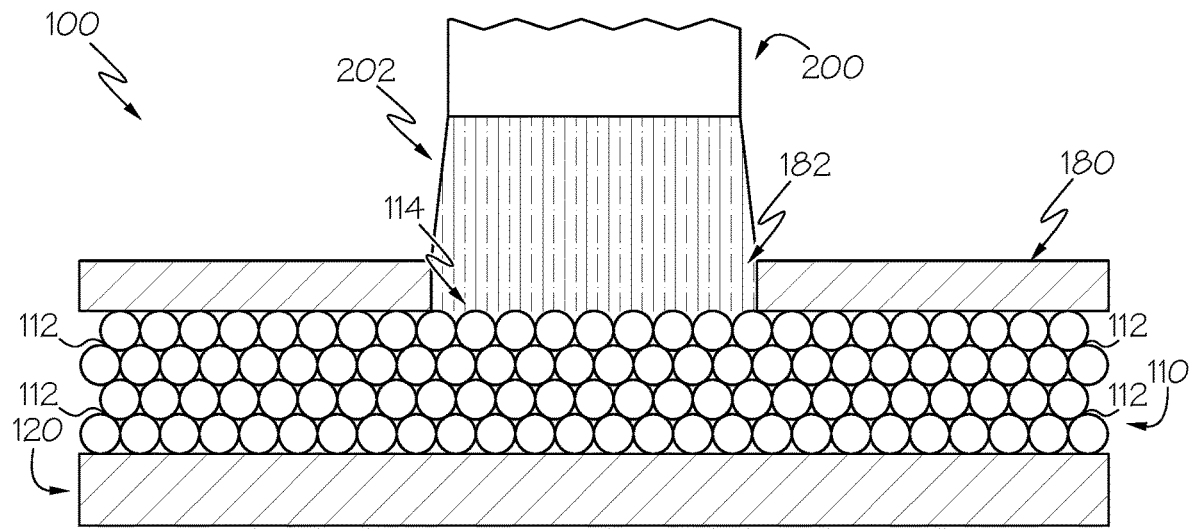
FIG. 3A schematically depicts a front view of a base substrate of the assembly of FIG. 1A with a plurality of sacrificial spheres, according to one or more embodiments shown and described herein.

Referring to FIG. 3A, a side view of a section of the assembly 100 is depicted. To form the assembly 100, a plurality of sacrificial spheres 110 are positioned on the base substrate 120. The plurality of sacrificial spheres 110 may be formed of a material that can be selectively removed during the assembly process. For example, in some embodiments, the plurality of sacrificial spheres 110 may be formed from a polymer, such as polystyrene or the like. In embodiments, individual spheres of the plurality of sacrificial spheres 110 are in contact with one another at contact points 112. The contact points 112 may be utilized to form the plurality of networked pores 196 (FIG. 2) extending throughout the MIO structure 108 (FIG. 2), as described in greater detail herein. In embodiments, each of the plurality of sacrificial spheres 110 define a diameter that is greater than about 100 nanometers. In some embodiments, each of the sacrificial spheres define a diameter that is between 100 nanometers and 10 micrometers, inclusive of the endpoints. As described in greater detail herein, the geometry of the sacrificial spheres 100 corresponds to the geometry of the plurality of cavities 194 (FIG. 2) of the MIO structure 108 (FIG. 2), and accordingly, in embodiments, each of the plurality of cavities 194 may have the same diameter as each of the plurality of sacrificial spheres 110.

With the plurality of sacrificial spheres 110 positioned on the base substrate 120, a region 114 of the plurality of sacrificial spheres 110 is heated. For example, in the embodiment depicted in FIG. 3A, an energy source 200 directs energy 202 onto the region 114 of the plurality of sacrificial spheres 110. In some embodiments, the energy source 200 may include an electromagnetic energy source a laser, such as a carbon dioxide laser or the like and may emit electromagnetic energy in a pulsed wave or a continuous wave. In some embodiments, the energy source may emit a single flash of electromagnetic energy to heat the region 114 of the plurality of sacrificial spheres 110. In some embodiments, the energy source 200 may emit thermal energy to heat the region 114 of the plurality of sacrificial spheres 110, and may include for example and without limitation, a hot surface that is brought into proximity or into contact with the region 114 of the plurality of sacrificial spheres 110.

In some embodiments, a mask 180 is positioned over the plurality of sacrificial spheres 110. In embodiments, the mask 180 defines an opening 182 positioned over the region 114 of the plurality of sacrificial spheres 110. The mask 180 blocks at least a portion of the energy 202 from the energy source 200, while allowing energy 202 to pass through the opening 182. In this way, energy 202 from the energy source 200 may be restricted from reaching portions of the plurality of sacrificial spheres 110 outside of the region 114.

The electromagnetic energy 202 heats the region 114 of the plurality of sacrificial spheres 110 above a melting point of the plurality of sacrificial spheres 110. As the spheres within the region 114 of the plurality of sacrificial spheres 110 melt, the spheres fuse together, forming a solid channel.

Figure 3B:
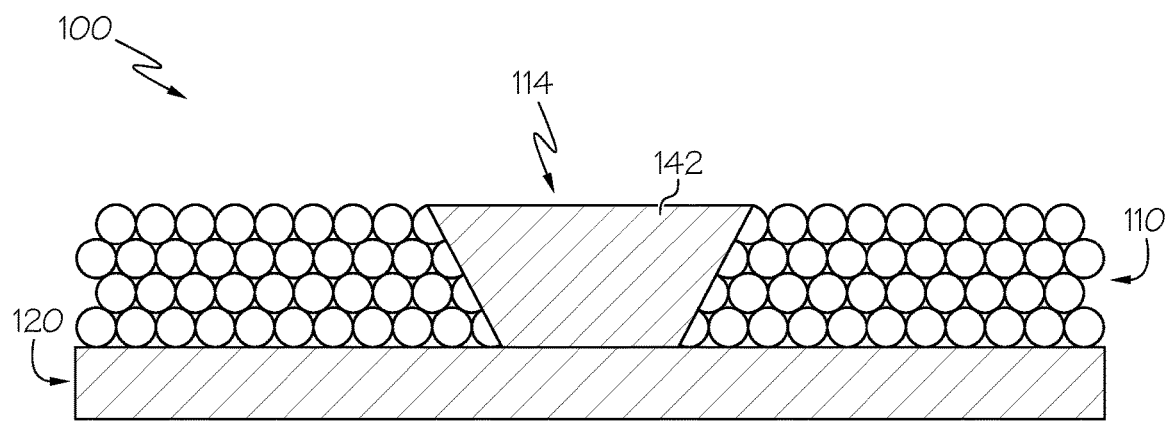
FIG. 3B schematically depicts a front view of the base substrate and the plurality of sacrificial spheres of FIG. 3A and a solid channel, according to one or more embodiments shown and described herein.

For example and referring to FIG. 3B, as the spheres of the plurality of sacrificial spheres 110 within the region 114 fuse together, the fused spheres form a solid channel 142. In particular, once the spheres of the plurality of sacrificial spheres 110 within the region 114 melt and are fused together, the spheres of the plurality of spheres within the region 114 cool (actively or passively) to form the solid channel 142. In some embodiments, for example in the embodiment depicted in FIG. 3B, the solid channel 142 may have a trapezoidal cross-section, being wider at an upper portion of the solid channel 142 as compared to a lower portion of the solid channel 142. For example, the penetration of the electromagnetic energy 202 (FIG. 3B) may decrease moving downward through the thickness of the plurality of sacrificial spheres 110, causing fewer spheres of the plurality of sacrificial spheres 110 within the region 114 to fuse together at a lower portion of the region 114 near the base substrate 120 as compared to an upper portion of the region 114 positioned above the lower portion.

Once the solid channel 142 is formed, material is then electrodeposited between spheres of the plurality of sacrificial spheres 110 and around the solid channel 142. For example in some embodiments, metal is deposited between spheres of the plurality of sacrificial spheres 110 and around the solid channel 142 through an electrodepositing process or the like, and the metal deposited may be copper, nickel, or the like. In some embodiments, a polymer, a semiconductor material, or the like is electrodeposited between spheres of the plurality of sacrificial spheres 110 and around the solid channel 142. While material can be electrodeposited between spheres of the plurality of sacrificial spheres 110 and around the solid channel 142, material is restricted from being electrodeposited in spaces occupied by the plurality of sacrificial spheres 110 and the solid channel 142. Further, material is restricted from being electrodeposited at the contact points 112 (FIG. 3A) where spheres of the plurality of sacrificial spheres 110 contact one another.

With the material deposited between spheres of the plurality of sacrificial spheres 110 and around the solid channel 142, the plurality of sacrificial spheres 110 and the solid channel 142 are removed, such that the material between the plurality of sacrificial spheres 110 and around the solid channel 142 remains, forming the MIO structure 108 and the flow channel 140, respectively. For example, in some embodiments, such as embodiments in which the plurality of sacrificial spheres 110 and the solid channel 142 are formed of polystyrene, the plurality of sacrificial spheres 110 and the solid channel 142 may be removed by dissolving the plurality of sacrificial spheres 110 and the solid channel 142 with a solution, such as acetone or the like. While reference is made herein to the sacrificial spheres 110 and the solid channel 142 being formed of polystyrene and the solution comprising acetone, it should be understood that the plurality of sacrificial spheres 110 and the solid channel 142 may be formed of any substance that can be dissolved/removed by a solution.

Figure 3C:
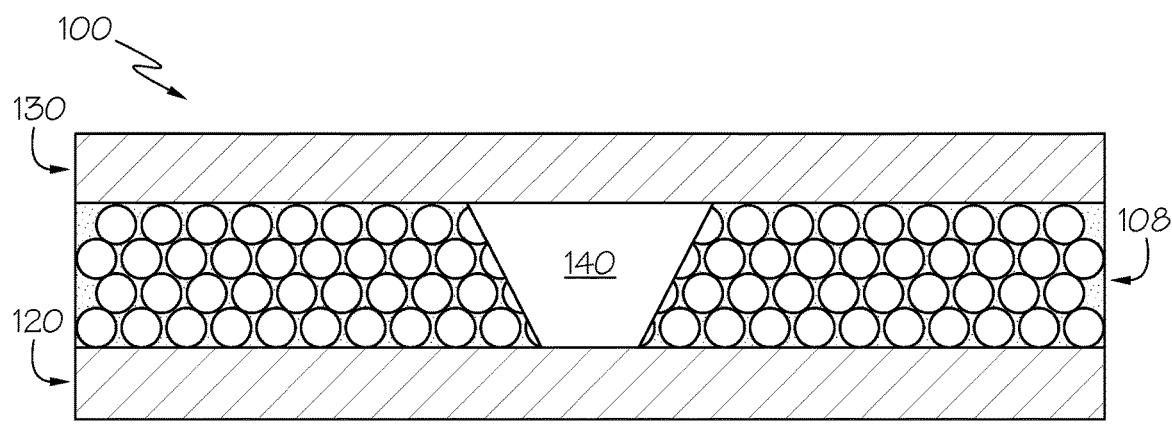
FIG. 3C schematically a front view depicts the base substrate and the MIO structure defining a flow channel, according to one or more embodiments shown and described herein.

With the sacrificial spheres 110 and the solid channel 142 removed, the metal deposited between the spheres of the plurality of sacrificial spheres 110 and around the solid channel 142 remain, forming the MIO structure 108 and the flow channel 140, as shown in FIG. 3C. In particular, the space previously occupied by the plurality of sacrificial spheres 110 form the plurality of cavities 194 (FIG. 2), while the space previously occupied by the solid channel 142 forms the flow channel 140 (FIG. 1). Further, the contact points 112 (FIG. 3A) at which spheres of the plurality of sacrificial spheres 110 contact one another form the networked pores 196 (FIG. 2) extending between cavities of the plurality of cavities 194 (FIG. 2).

Before or after removing the plurality of sacrificial spheres 110 and the solid channel 142, the capping layer 130 may be positioned on the assembly 100. For example and referring to FIG. 3C, in embodiments, the capping layer 130 is positioned over the MIO structure 108. While in the embodiment depicted in FIG. 3C, the capping layer 130 is positioned over MIO structure 108, in some embodiments, the capping layer 130 is positioned over the plurality of sacrificial spheres 110 (FIG. 3B) and the solid channel 142 (FIG. 3B) before the sacrificial spheres 110 (FIG. 3B) and the solid channel 142 (FIG. 3B) are removed. For example, in embodiments in which the capping layer 130 is metallic, the capping layer 130 may be deposited (e.g., through electrodeposition) over the plurality of the sacrificial spheres 110 (FIG. 3B) and the solid channel 142 (FIG. 3B). In some embodiments, the capping layer 130 may include the same metal that is deposited between spheres of the plurality of sacrificial spheres 110 (FIG. 3B) and around the solid channel 142 (FIG. 3B).

In embodiments in which the capping layer 130 includes a dielectric layer, the capping layer 130 may be positioned over the MIO structure 108. In these embodiments, the capping layer 130 may be positioned over the MIO structure 108 by any suitable process, for example and without limitation, atomic layer deposition or the like.

In some embodiments, a coating may be applied to the channel 140 or discrete portions of the channel 140 to restrict the flow of fluid from the channel 140 outward into the MIO structure 108. The coating may include any suitable coating for restricting the flow of fluid between the channel 140 and the MIO structure 108 and may include for example and without limitation, sealants, hydrophobic materials, or the like.

Figure 4:
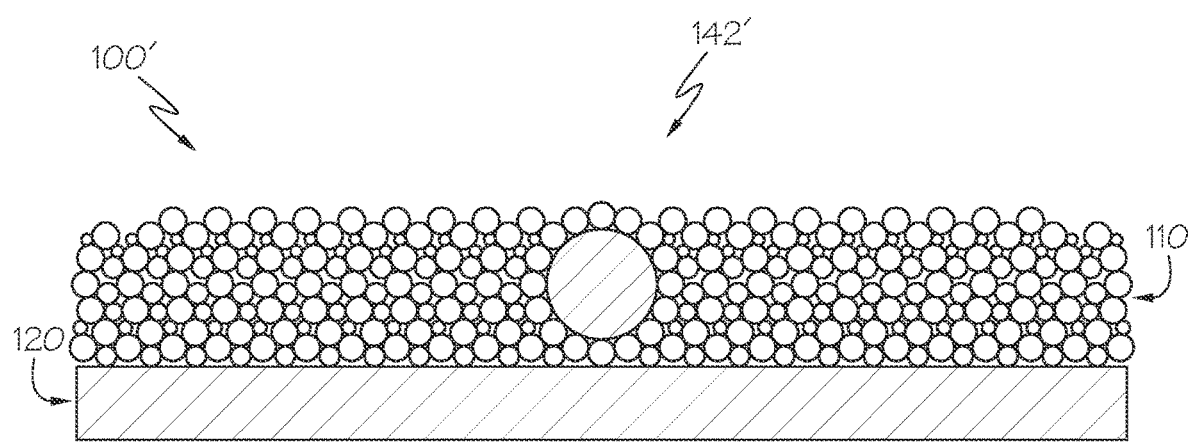
FIG. 4 schematically depicts a front view of a base substrate, a plurality of sacrificial spheres, and a solid channel, according to one or more embodiments shown and described herein.

Referring to FIG. 4, another embodiment of the assembly 100' is schematically depicted. Similar to the embodiment described above and depicted in FIGS. 3B and 3C, the assembly 100' includes the base substrate 120 and the plurality of sacrificial spheres 110. However, in the embodiment depicted in FIG. 4, the solid channel 142' defines a circular cross-section, and may be formed as a solid cylinder. For example, in the embodiment depicted in FIG. 4, the solid channel 142' may be formed prior to being positioned within the plurality of sacrificial spheres 110 on the base substrate 120. For example, instead of being formed by fusing sacrificial spheres 110 together as described above and as depicted in FIGS. 3B and 3C, the solid channel 142' may be separately formed, for example through a Lithographie, Galvanoformung, Abformung (LIGA) process, a photoresist process, or any suitable manufacturing process for forming a nanosolid structure.

Similar to the embodiment described above and depicted in FIGS. 3B and 3C, once the solid channel 142' is positioned between spheres of the plurality of sacrificial spheres 110, material can be electrodeposited between the spheres of the plurality of sacrificial spheres 110 and around the solid channel 142'. The plurality of sacrificial spheres 110 and the solid channel 142' can then be removed to form the MIO structure 108 (FIG. 1A).

Figure 5:
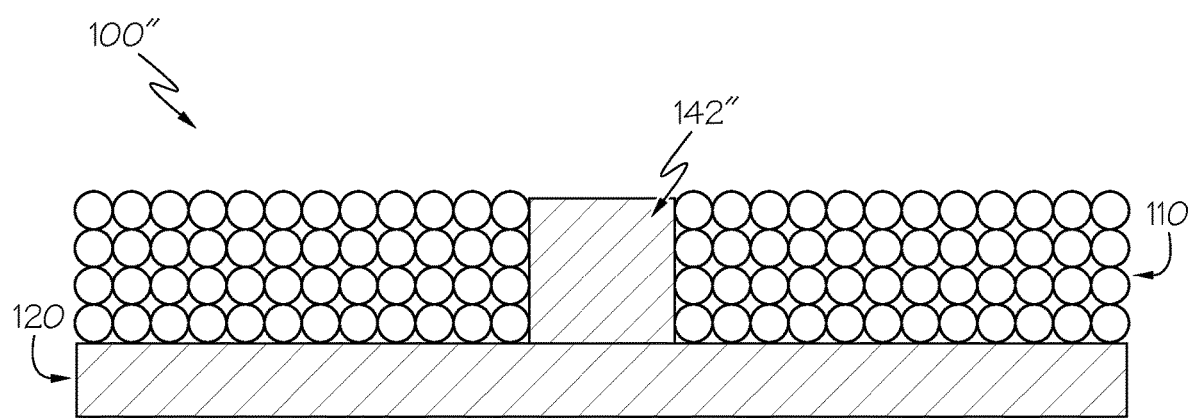
FIG. 5 schematically depicts a front view of a base substrate, a plurality of sacrificial spheres, and another solid channel, according to one or more embodiments shown and described herein.
Figure 6:
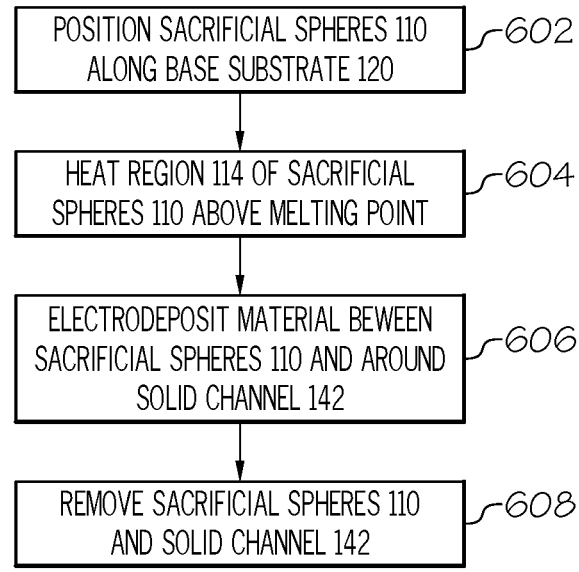
FIG. 6 depicts a block diagram of a method for forming an assembly including a MIO structure with a flow channel, according to one or more embodiments shown and described herein.

Referring to FIG. 5, another embodiment of the assembly 100" is schematically depicted. Similar to the embodiment described above and depicted in FIG. 4, the assembly 100" includes the base substrate 120 and the plurality of sacrificial spheres 110. Moreover, similar to the embodiment depicted in FIG. 4, the assembly 100" depicted in FIG. 5 includes the solid channel 142" that is formed from a process other than fusing spheres of the plurality of sacrificial spheres 110 on the base substrate 120. However, in the embodiment depicted in FIG. 5, the solid channel 142" includes a rectangular cross-section and may be formed as a solid rectangular prism. While the embodiments depicted in FIGS. 4 and 5 show solid channels 142' and 142" including a circular and a rectangular cross-section, respectively, it should be understood that these are merely examples, and solid channels according to embodiments described herein may include any suitably shaped cross-section to form the flow channel 140 (FIG. 1).

Referring to FIGS. 3A-3C and 6, a block diagram of a method for forming an assembly 100 is depicted. In a first block 602, the plurality of sacrificial spheres 110 are positioned along the base substrate 120. At block 604, the region 114 of the plurality of sacrificial spheres 110 are heated above a melting point of the plurality of sacrificial spheres 110 to form the solid channel 142. At block 606, the material is electrodeposited between the plurality of sacrificial spheres 110 and around the solid channel 142. At block 608 the plurality of sacrificial spheres 110 and the solid channel 142 are removed to form the MIO structure 108 (FIG. 1) and the flow channel 140 (FIG. 1) extending through the MIO structure 108.

Figure 7:
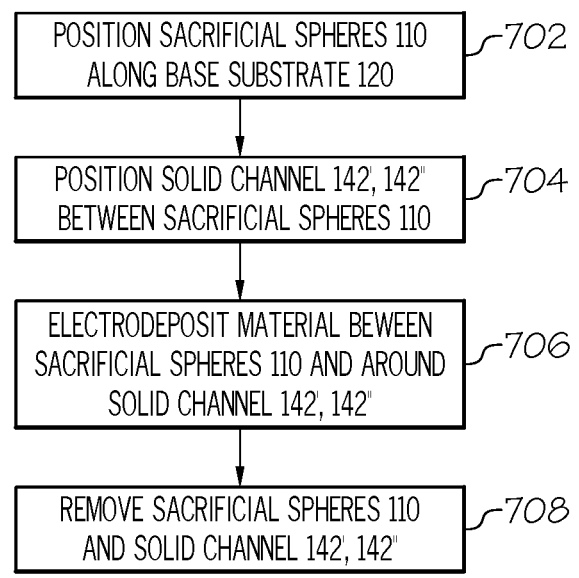
FIG. 7 depicts a block diagram of another method for forming an assembly including a MIO structure with a flow channel, according to one or more embodiments shown and described herein.

Referring to FIGS. 4, 5, and 7, a block diagram of another method for forming an assembly is depicted. In a first block 702, the plurality of sacrificial spheres 110 are positioned along the base substrate 120. At block 704, the solid channel 142', 142" is positioned between spheres of the plurality of sacrificial spheres. At block 706, the material is electrodeposited between the plurality of sacrificial spheres 110 and around the solid channel 142', 142". At block 708 the plurality of sacrificial spheres 110 and the solid channel 142', 142" are removed to form the MIO structure 108 (FIG. 1) and the flow channel 140 (FIG. 1) extending through the MIO structure 108.

It should now be understood that embodiments described herein are generally directed to assemblies for cooling a heat generating device. In particular, embodiments described herein are directed to cooling assemblies including a MIO structure. One or more flow channels are formed within the MIO structure, and cooling fluid may be passed through the one or more flow channels. The one or more flow channels can increase the amount of cooling fluid that may be passed through the MIO structure, thereby increasing the amount of heat that can be dissipated from the heat-generating device. Further, in some applications, the one or more flow channels may be utilized to direct the cooling fluid through the MIO structure, for example to impinge the cooling fluid on a target surface to cool the heat-generating device.

It is noted that the term "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. The terms "top", "bottom" and "middle" are used in relation to the figures and are not meant to define an exact orientation of power electronics assemblies or layers used to form power electronic assemblies described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for forming a flow channel in a MIO structure, the method comprising:
    positioning a plurality of sacrificial spheres along a base substrate;
    heating a region of the plurality of sacrificial spheres above a melting point of the plurality of sacrificial spheres, thereby fusing the plurality of sacrificial spheres together and forming a solid channel, wherein heating the region of the plurality of sacrificial spheres comprises directing electromagnetic energy onto the region of the plurality of sacrificial spheres with an electromagnetic energy source;
    electrodepositing material between the plurality of sacrificial spheres and around the solid channel;
    removing the plurality of sacrificial spheres to form the MIO structure; and
    removing the solid channel to form the flow channel extending through the MIO structure.

2. The method of claim 1, wherein removing the plurality of sacrificial spheres comprises dissolving the plurality of sacrificial spheres with a solution.

3. The method of claim 1, wherein removing the solid channel comprises dissolving the solid channel with a solution.

4. The method of claim 1, wherein electrodepositing the material comprises electrodepositing copper or nickel between the plurality of sacrificial spheres and around the solid channel.

5. The method of claim 1, further comprising positioning a capping layer over the MIO structure.

6. The method of claim 1, further comprising positioning a dielectric layer over the MIO structure.

7. The method of claim 1, further comprising positioning a mask over the plurality of sacrificial spheres, wherein the mask defines an opening positioned over the region of the plurality of sacrificial spheres, and wherein the mask blocks at least a portion of the electromagnetic energy from the electromagnetic energy source.

8. The method of claim 1, wherein the electromagnetic energy source comprises a laser.

9. The method of claim 1, wherein the flow channel extending through the MIO structure defines a channel span between 1 micrometer and 100 micrometers.

10. A method for forming a flow channel in a MIO structure, the method comprising:
    positioning a plurality of sacrificial spheres along a base substrate;
    positioning a solid channel between spheres of the plurality of sacrificial spheres, at least some of the plurality of sacrificial spheres positioned between the solid channel and the base substrate;
    electrodepositing a material between the plurality of sacrificial spheres and around the solid channel;
    removing the plurality of sacrificial spheres to form the MIO structure; and
    removing the solid channel to form the flow channel extending through the MIO structure, wherein at least a portion of the MIO structure is positioned between the flow channel and the base substrate.

11. The method of claim 10, wherein the solid channel comprises a cylinder extending through the plurality of sacrificial spheres.

12. The method of claim 10, wherein the solid channel comprises a rectangular prism extending through the plurality of sacrificial spheres.

13. The method of claim 10, wherein the flow channel extending through the MIO structure defines a channel span between 1 micrometer and 100 micrometers.

14. The method of claim 10, wherein the plurality of sacrificial spheres comprises a plurality of polymer spheres.

15. The method of claim 10, wherein removing the plurality of sacrificial spheres comprises dissolving the plurality of sacrificial spheres with a solution.

16. The method of claim 10, wherein removing the solid channel comprises dissolving the solid channel with a solution.

17. The method of claim 10, wherein electrodepositing the material comprises electrodepositing copper or nickel between the plurality of sacrificial spheres and around the solid channel.

18. The method of claim 10, further comprising positioning a capping layer over the MIO structure.

19. The method of claim 10, further comprising positioning a dielectric layer over the MIO structure.

* * * * *